(12) United States Patent
Katoh

(10) Patent No.: US 9,123,820 B2
(45) Date of Patent: Sep. 1, 2015

(54) THIN FILM TRANSISTOR INCLUDING SEMICONDUCTOR OXIDE LAYER HAVING REDUCED RESISTANCE REGIONS

(75) Inventor: Sumio Katoh, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 63 days.

(21) Appl. No.: 13/640,354

(22) PCT Filed: Mar. 2, 2011

(86) PCT No.: PCT/JP2011/001225
§ 371 (c)(1),
(2), (4) Date: Oct. 10, 2012

(87) PCT Pub. No.: WO2011/151955
PCT Pub. Date: Dec. 8, 2011

(65) Prior Publication Data
US 2013/0048998 A1 Feb. 28, 2013

(30) Foreign Application Priority Data
May 31, 2010 (JP) .................................. 2010-124364

(51) Int. Cl.
*H01L 29/04* (2006.01)
*H01L 29/786* (2006.01)
(Continued)

(52) U.S. Cl.
CPC .......... *H01L 29/7869* (2013.01); *G02F 1/1368* (2013.01); *H01L 29/41733* (2013.01); *H01L 29/66969* (2013.01); *H01L 29/78618* (2013.01); *H01L 29/78696* (2013.01)

(58) Field of Classification Search
USPC .............................. 257/59, E29.151; 438/149
See application file for complete search history.

(56) References Cited

U.S. PATENT DOCUMENTS

| 5,953,595 A | 9/1999 | Gosain et al. |
| 7,297,977 B2 | 11/2007 | Hoffman et al. |

(Continued)

FOREIGN PATENT DOCUMENTS

| JP | 09-153625 A | 6/1997 |
| JP | 2005-302808 A | 10/2005 |

(Continued)

OTHER PUBLICATIONS

Microelectronic Materials (C.R.M. Grovenor, § 2.4.4(a), (1998), p. 92).*

(Continued)

*Primary Examiner* — Matthew Gordon
(74) *Attorney, Agent, or Firm* — Keating & Bennett, LLP

(57) ABSTRACT

A semiconductor device ($S_T$) includes a substrate (11), a gate electrode (12b), a gate insulating film (13b), an oxide semiconductor film (14b) including a channel part (14bc) formed in a position facing the gate electrode (12b), a source electrode (15bs), and a drain electrode (15bd). The source electrode (15bs) and the drain electrode (15bd) is arranged so as not to overlap with the gate electrode (12b) as viewed in the plane. A region adjacent to the gate electrode (12b) and the source electrode (15bs) and a region adjacent to the gate electrode (12b) and the drain electrode (15bd) are, in a region where the source electrode (15bs) and the drain electrode (15bd) does not overlap with the gate electrode (12b), processed such that resistance in a region of the oxide semiconductor film (14b) including a surface thereof is reduced.

19 Claims, 14 Drawing Sheets

(51) Int. Cl.
*H01L 29/417* (2006.01)
*G02F 1/1368* (2006.01)
*H01L 29/66* (2006.01)

(56) References Cited

U.S. PATENT DOCUMENTS

| | | |
|---|---|---|
| 7,382,421 B2 | 6/2008 | Hoffman et al. |
| 7,732,819 B2 | 6/2010 | Akimoto et al. |
| 7,791,072 B2 | 9/2010 | Kumomi et al. |
| 7,868,326 B2 | 1/2011 | Sano et al. |
| 2005/0039670 A1 | 2/2005 | Hosono et al. |
| 2006/0292726 A1 | 12/2006 | Akimoto et al. |
| 2007/0072439 A1* | 3/2007 | Akimoto et al. .............. 438/795 |
| 2007/0278490 A1* | 12/2007 | Hirao et al. ...................... 257/64 |
| 2008/0067508 A1* | 3/2008 | Endo et al. ....................... 257/43 |
| 2008/0241981 A1* | 10/2008 | Machida et al. ................ 438/30 |
| 2009/0001374 A1 | 1/2009 | Inoue et al. |
| 2010/0079425 A1* | 4/2010 | Yamazaki et al. ............ 345/206 |
| 2010/0301329 A1* | 12/2010 | Asano et al. ..................... 257/43 |
| 2011/0272699 A1 | 11/2011 | Akimoto et al. |

FOREIGN PATENT DOCUMENTS

| | | |
|---|---|---|
| JP | 2006-179878 A | 7/2006 |
| JP | 2007-123861 A | 5/2007 |
| JP | 2007-235102 A | 9/2007 |
| JP | 2008-072025 A | 3/2008 |
| JP | 4164562 B2 | 10/2008 |
| JP | 2010-040645 A | 2/2010 |

OTHER PUBLICATIONS

Official Communication issued in International Patent Application No. PCT/JP2011/001225, mailed on May 24, 2011.

* cited by examiner (a)

(b)

THIN FILM TRANSISTOR INCLUDING SEMICONDUCTOR OXIDE LAYER HAVING REDUCED RESISTANCE REGIONS

TECHNICAL FIELD

The present invention relates to a semiconductor device including an oxide semiconductor film. In addition, the present invention relates to a thin film transistor substrate including the semiconductor device and to a display apparatus.

As an active matrix substrate, a thin film transistor substrate (hereinafter also referred to as a "TFT substrate") in which a thin film transistor (hereinafter also referred to as a "TFT") is, as a switching element, provided for each pixel which is the minimum unit of an image has been broadly used.

A TFT having a typical configuration includes, e.g., a gate electrode provided on an insulating substrate, a gate insulating film provided so as to cover the gate electrode, a semiconductor layer provided on the gate insulating film so as to have an island shape and overlap with the gate electrode, and a source electrode and a drain electrode provided so as to face each other on the semiconductor layer. As the semiconductor layer, a layer made of an amorphous silicon semiconductor film is typically used (see, e.g., Patent Document 1).

A TFT substrate is manufactured by forming pixel electrodes on a polarized film. In addition, a liquid crystal display apparatus is manufactured by providing a counter substrate so as to face the TFT substrate and providing a liquid crystal layer between the TFT substrate and the counter substrate.

CITATION LIST

Patent Document

Patent Document 1: Japanese Patent Publication No. 2005-302808

SUMMARY OF THE INVENTION

Technical Problem

In recent years, a TFT using a semiconductor film (hereinafter also referred to as an "oxide semiconductor film") made of an oxide semiconductor has been, as a TFT for each pixel which is the minimum unit of an image, proposed for a TFT substrate instead of a TFT using a semiconductor film made of amorphous silicon (a-Si). The oxide semiconductor film has the following advantages over the a-Si semiconductor film: the oxide semiconductor film has high electron mobility; a low-temperature process is available for the oxide semiconductor film; and the oxide semiconductor film has small property fluctuation of the TFT caused due to electric stress. Particular attention has been drawn to the TFT using the oxide semiconductor film for formation of a small driver circuit area because such a TFT has the high electron mobility and the small property fluctuation caused due to the electric stress.

In addition, in recent years, there has been a great need for size reduction of a display apparatus mounted in mobile equipment, and study and development have been actively made on a monolithic display apparatus for which a retrofitted driver chip is not necessary because of simultaneous formation of the TFTs and a driver circuit in the display apparatus. Since the small driver circuit area can be formed, the oxide semiconductor TFT is preferable as a TFT used for the monolithic display apparatus. It has been expected that the oxide semiconductor TFT is applied to the monolithic display apparatus.

Typically, a bottom-gate structure manufactured at low cost is employed for a TFT of a display apparatus. In the bottom-gate structure, a gate electrode and a source electrode partially overlap with each other, and the gate electrode and a drain electrode partially overlap with each other. If a driver circuit is formed by the TFTs having such a structure, parasitic capacitance is generated at the foregoing overlap parts. Thus, it is necessary that the channel width of the thin film transistor is increased in order to reduce the parasitic capacitance (see FIG. 18). Particularly a thin film transistor forming the last stage of a buffer circuit of a gate driver is intended for current larger than that of a thin film transistor in a pixel region. Thus, the channel width of the TFT should be significantly increased. Under present circumstances, the thin film transistor forming the last stage of the buffer circuit of the gate driver is formed so as to have, e.g., a channel width of about 800 μm.

The present inventors have found that the thin film transistor using the oxide semiconductor film has a property that an increase in channel width W results in higher probability of occurrence of short-circuit in the TFT (see FIG. 19). That is, the increase in channel width of the thin film transistor using the oxide semiconductor film results in reduction in yield rate of the TFT.

The present invention has been made in view of the foregoing, and it is an objective of the present invention to provide, with a good yield rate, a semiconductor device including an oxide semiconductor film, a thin film transistor substrate including the semiconductor device, and a display apparatus.

Solution to the Problem

In order to accomplish the foregoing objective, a first aspect of the present invention is intended for a semiconductor device including a substrate; a gate electrode provided on the substrate; a gate insulating film provided so as to cover the gate electrode; an oxide semiconductor film provided on the gate insulating film and including a channel part formed in a position facing the gate electrode; and a source electrode and a drain electrode provided apart from each other on the oxide semiconductor film with the channel part being interposed between the source electrode and the drain electrode. At least one of the source electrode and the drain electrode is arranged so as not to overlap with the gate electrode as viewed in plane, and a region adjacent to the gate electrode and the source electrode and a region adjacent to the gate electrode and the drain electrode are, in a region where the at least one of the source electrode and the drain electrode does not overlap with the gate electrode, processed for resistance reduction in a region of the oxide semiconductor film including a surface thereof.

According to the foregoing configuration, the gate electrode and the source electrode do not overlap with each other, or the gate electrode and the drain electrode do not overlap with each other. Thus, parasitic capacitance $C_{gs}$ generated between the gate electrode and the source electrode or parasitic capacitance $C_{gd}$ generated between the gate electrode and the drain electrode can be reduced. Even if the gate electrode and the source electrode do not overlap with each other, or the gate electrode and the drain electrode do not overlap with each other, the region adjacent to the gate electrode and the source electrode and the region adjacent to the gate electrode and the drain electrode are processed such that the resistance thereof is reduced. Thus, the parasitic capacitance $C_{gs}$, $C_{gd}$ can be reduced without reducing on-state current of the thin film transistor. The parasitic capacitance generated between the gate electrode and the source electrode and/or between the gate electrode and the drain electrode is reduced, thereby reducing the channel width of the semiconductor device. Due to the reduction in channel width of the semiconductor device including the oxide semiconductor film, short-circuit of the semiconductor device is less likely to occur, and, as a result, a good yield rate can be obtained.

A second aspect of the invention is intended for the semiconductor device of the first aspect of the invention, in which sheet resistance in the region of the oxide semiconductor film where the resistance is reduced is 10 Ω/sq-100 kΩ/sq.

According to the foregoing configuration, even if the gate electrode and the source electrode do not overlap with each other, and/or the gate electrode and the drain electrode do not overlap with each other, the region adjacent to the gate electrode and the source electrode and the region adjacent to the gate electrode and the drain electrode are processed such that the resistance thereof is reduced, and therefore the sheet resistance is 10 Ω/sq-100 kΩ/sq. Thus, on-state current of the semiconductor device is not reduced.

A third aspect of the invention is intended for the semiconductor device of the first or second aspect of the invention, in which the channel part has a channel width of equal to or less than 50 μm.

According to the foregoing configuration, since the channel width of the semiconductor device is equal to or less than 50 μm, the short-circuit of the semiconductor device is less likely to occur. Thus, the good yield rate of the semiconductor device can be obtained.

A fourth aspect of the invention is intended for the semiconductor device of any one of the first to third aspects of the invention, in which the oxide semiconductor film is made of metal oxide containing at least one selected from a group consisting of indium (In), gallium (Ga), and zinc (Zn).

According to the foregoing configuration, although the oxide semiconductor layer made of the foregoing material is amorphous, the mobility thereof is high. Thus, on-state resistance of the semiconductor device can be increased.

A fifth aspect of the invention is intended for the semiconductor device of the fourth aspect of the invention, in which the oxide semiconductor film is made of In—Ga—Zn—O metal oxide.

According to the foregoing configuration, good properties of the TFT such as high mobility and low off-state current can be obtained.

Since the semiconductor device of any one of the first to fifth aspects of the invention has the small channel width, the short-circuit is less likely to occur, and the good yield rate can be obtained. Thus, if the semiconductor device of any one of the first to fifth aspects of the invention is a thin film transistor as in a sixth aspect of the invention, the semiconductor device can be suitably used for a thin film transistor substrate including the thin film transistor on a substrate body.

The thin film transistor substrate of the sixth aspect of the invention includes the semiconductor device in which the gate electrode and the source electrode do not overlap with each other and/or the gate electrode and the drain electrode do no overlap with each other. The parasitic capacitance generated between the gate electrode and the source electrode and between the gate electrode and the drain electrode is reduced, thereby reducing the channel width. Thus, the short-circuit of the semiconductor device is less likely to occur, and the good yield rate can be obtained. Consequently, the thin film transistor substrate can be suitably used for the semiconductor device which conventionally requires a great channel width if the semiconductor device of any one of the first to fifth aspects of the invention is, as in a seventh aspect of the invention, provided at the last stage of a buffer circuit of a gate driver region and is intended for large current.

The thin film transistor substrate of the sixth or seventh aspect of the invention includes the semiconductor device having the channel width reduced by the reduction in parasitic capacitance generated between the gate electrode and the source electrode and/or between the gate electrode and the drain electrode. Thus, the thin film transistor substrate has excellent properties such as a good yield rate. Consequently, the thin film transistor substrate of the present invention can be suitably used for a display apparatus which, as in an eighth aspect of the invention, includes the thin film transistor substrate of the sixth or seventh aspect of the invention; a counter substrate arranged so as to face the thin film transistor substrate; and a display medium layer provided between the thin film transistor substrate and the counter substrate.

The display apparatus of the present invention can be suitably used for the display apparatus in which the display medium layer is a liquid crystal layer as in a ninth aspect of the invention.

Advantages of the Invention

According to the present invention, the gate electrode and the source electrode do not overlap with each other, or the gate electrode and the drain electrode do not overlap with each other. Thus, the parasitic capacitance $C_{gs}$ generated between the gate electrode and the source electrode or the parasitic capacitance $C_{gd}$ generated between the gate electrode and the drain electrode can be reduced. Even if the gate electrode and the source electrode do not overlap with each other, or the gate electrode and the drain electrode do not overlap with each other, the region adjacent to the gate electrode and the source electrode and the region adjacent to the gate electrode and the drain electrode are processed such that the resistance thereof is reduced. Thus, the parasitic capacitance $C_{gs}$, $C_{gd}$ can be reduced without reducing on-state current of the thin film transistor. The parasitic capacitance generated between the gate electrode and the source electrode and/or between the gate electrode and the drain electrode is reduced, thereby reducing the channel width of the semiconductor device. Due to the reduction in channel width of the semiconductor device including the oxide semiconductor film, the short-circuit of the semiconductor device is less likely to occur, and, as a result, the good yield rate can be obtained.

As described above, the good yield rate can be obtained for the semiconductor device including the oxide semiconductor film, and can be also obtained for the thin film transistor substrate including the semiconductor film and for the display apparatus.

DESCRIPTION OF EMBODIMENTS

An embodiment of the present invention will be described below in detail with reference to drawings. Note that the present invention is not limited to the embodiment described below.

(Configuration of Liquid Crystal Display Apparatus)

Figure 1:
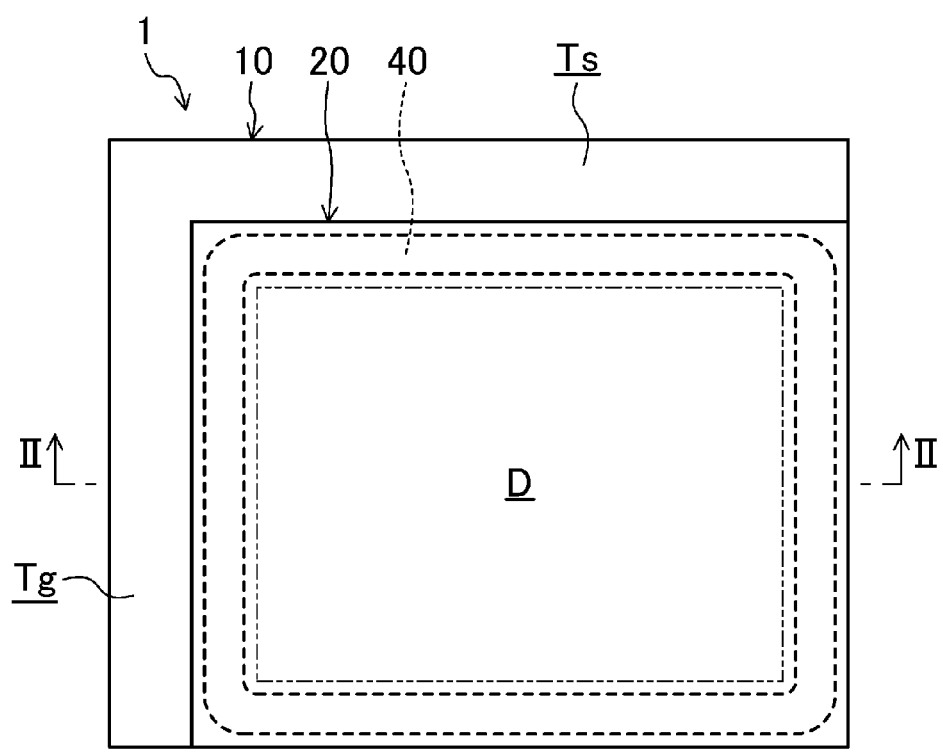
FIG. 1 is a plan view of a liquid crystal display apparatus of an embodiment.
Figure 2:
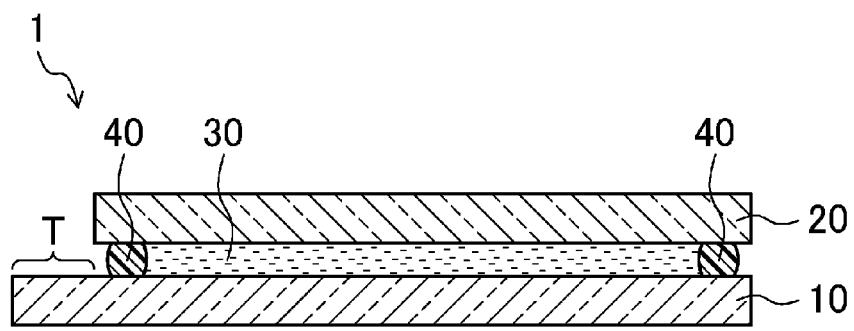
FIG. 2 is a cross-sectional view along an II-II line illustrated in FIG. 1.
Figure 3:
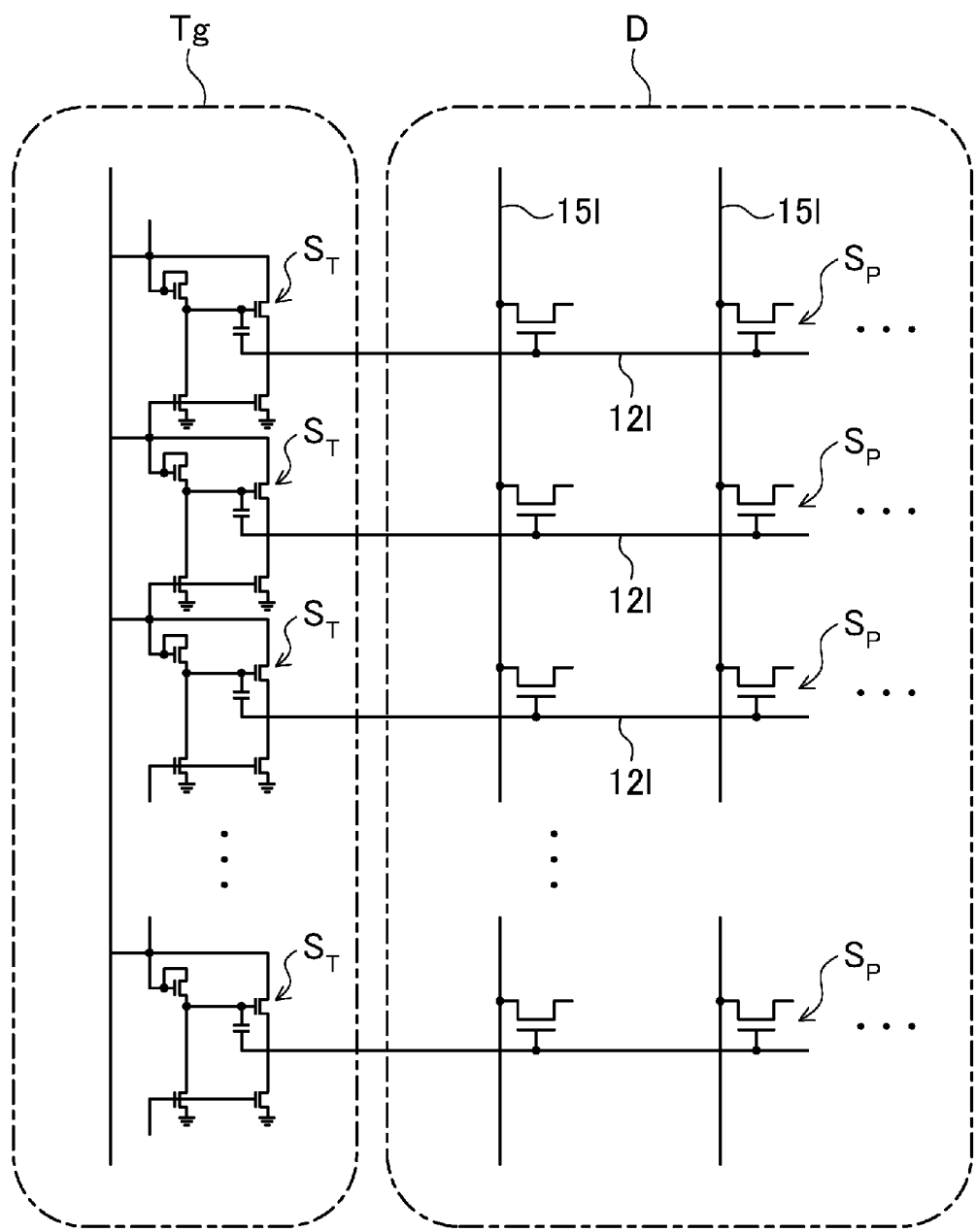
FIG. 3 is a schematic diagram illustrating an electronic circuit of the liquid crystal display apparatus of the embodiment.
Figure 4:
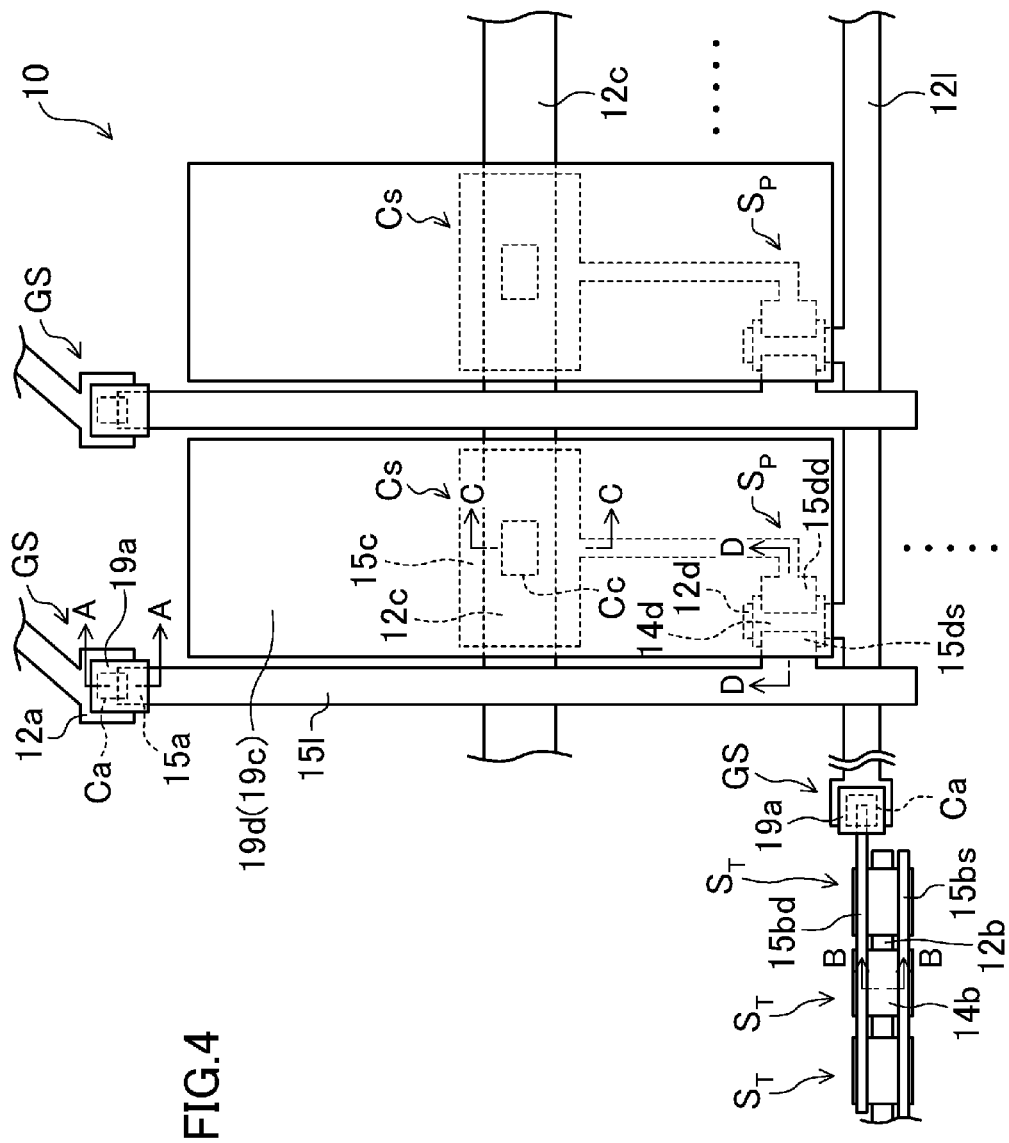
FIG. 4 is an enlarged plan view illustrating a main part of the liquid crystal display apparatus of the embodiment.
Figure 5:
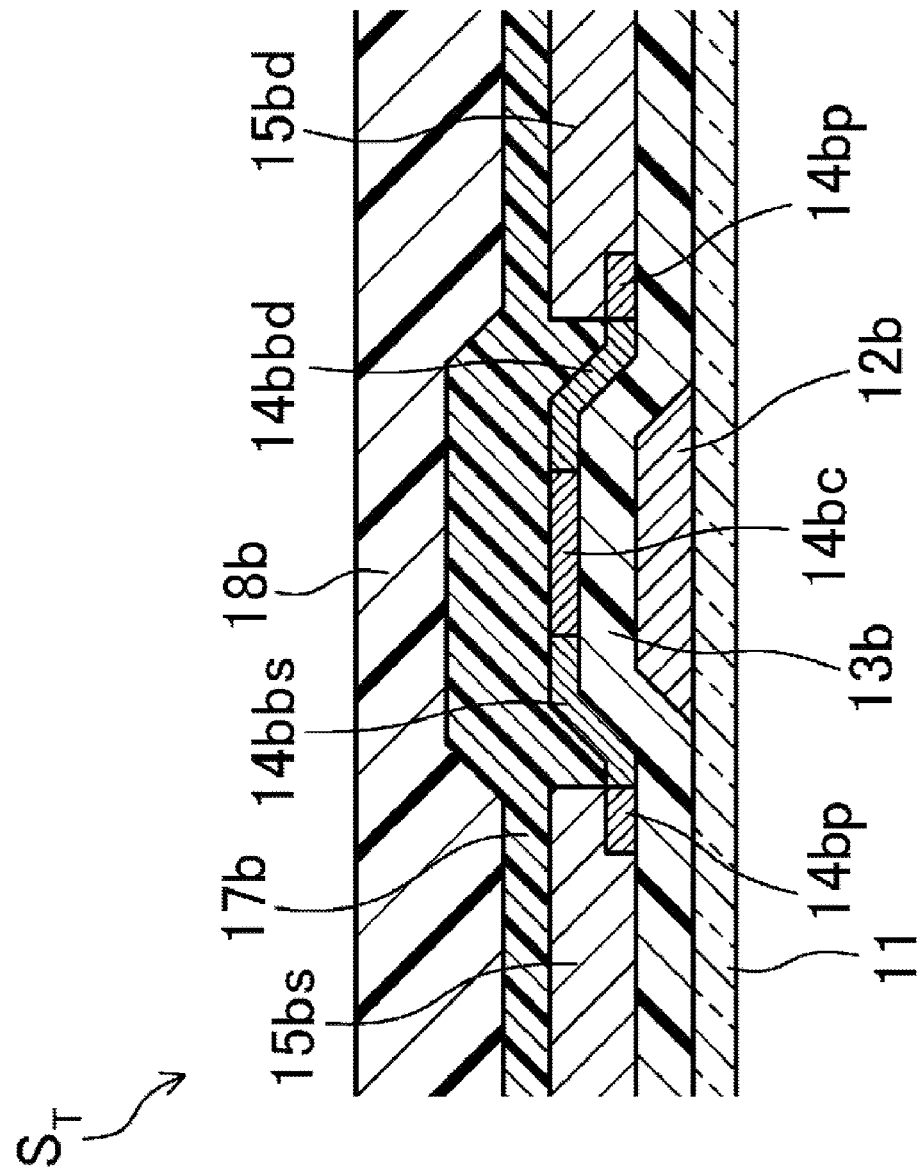
FIG. 5 is a cross-sectional view of a thin film transistor of the embodiment along a B-B line illustrated in FIG. 4.

FIG. 1 is a plan view illustrating a liquid crystal display apparatus 1 which includes a TFT substrate 10 having thin film transistors $S_T$ in the present embodiment, and FIG. 2 is a cross-sectional view along an II-II line illustrated in FIG. 1. In addition, FIG. 3 is an enlarged schematic electronic circuit diagram illustrating a display region D and a gate driver region Tg of the TFT substrate 10 including the thin film transistors in the present embodiment. FIG. 4 is an enlarged plan view illustrating the display region D and the gate driver region Tg of the TFT substrate 10 including the thin film transistors $S_T$ in the present embodiment, and FIG. 5 is a cross-sectional view of the thin film transistor of the present embodiment along a B-B line illustrated in FIG. 4.

In the liquid crystal display apparatus 1, the TFT substrate 10 and a counter substrate 20 are arranged so as to face each other, and are bonded together by a sealing material 40 provided in an outer peripheral part of the substrate. In a region surrounded by the sealing material 40, a liquid crystal layer 30 is provided as a display medium layer.

In the liquid crystal display apparatus 1, the display region D where an image is displayed is formed in part of the liquid crystal display apparatus 1 on an inner side relative to the sealing material 40, and a terminal region T (i.e., the gate driver region Tg and a source driver region Ts) is formed in part of the TFT substrate 10 protruding beyond the counter substrate 20.

Referring to FIG. 3, the TFT substrate 10 includes, in the display region D, a plurality of scanning lines 121 provided so as to extend parallel to each other, a plurality of signal lines 151 provided so as to extend parallel to a direction perpendicular to each of the scanning lines 121, and a plurality of thin film transistors $S_p$ each provided at each pixel, i.e., at an intersection between the scanning line 121 and the signal line 151. In addition, a plurality of auxiliary capacitive lines (first conductive films) 12c extending parallel to each other are provided between adjacent ones of the scanning lines 121 (not shown in FIG. 3, and see FIG. 4). In the gate driver region Tg of the TFT substrate 10, a buffer circuit configured to apply current to each of the scanning lines 121 is formed, and the thin film transistor $S_T$ including the configuration of the present embodiment is provided at the last stage of the buffer circuit.

The TFT substrate 10 has a multi-layer structure, i.e., a structure in which the followings are stacked each other on a substrate 11: first conductive films 12a-12d; first insulating films 13a-13d; oxide semiconductor films 14b, 14d; second conductive films 15a-15d; passivation films 17a-17d; polarized films 18a-18d; and third conductive films 19a, 19c, 19d.

Referring to FIG. 5, in the thin film transistor $S_T$, the first conductive film 12b is provided as a gate electrode, and the oxide semiconductor film 14b is provided above the gate electrode 12b through the gate insulating film 13b provided so as to cover the gate electrode 12b. Note that a channel part 14bc is formed at a position of the oxide semiconductor film 14b facing the gate electrode 12b. A source electrode 15bs and a drain electrode 15bd formed from the second conductive film 15b are provided above the oxide semiconductor film 14b in the state in which the source electrode 15bs and the drain electrode 15bd are apart from each other so as to sandwich the channel part 14bc. The passivation film 17b and the polarized film 18b are stacked so as to cover the foregoing.

The gate electrode 12b, the gate insulating film 13b, the source electrode 15bs, the drain electrode 15bd, the passivation film 17b, and the polarized film 18b are each made of a publicly-known material.

The oxide semiconductor film 14b is made of, e.g., In—Ga—Zn—O (IGZO) metal oxide, and has a thickness of, e.g., about 10-200 nm. Although the IGZO metal oxide is amorphous, the mobility thereof is high. Thus, good properties of the thin film transistor $S_T$ such as high mobility and low off-state current can be obtained. Although it has been described that the oxide semiconductor film 14b is made of the IGZO metal oxide, the oxide semiconductor film 14b may be made of, e.g., metal oxide containing any one of In, Ga, and Zn. Although such metal oxide is amorphous, the mobility thereof is high. Thus, the thin film transistor $S_T$ having high on-state current can be formed.

The thin film transistor $S_T$ is formed such that the source electrode 15bs and the gate electrode 12b do not overlap with each other as viewed in the plane, and that the drain electrode 15bd and the gate electrode 12b do not overlap with each other as viewed in the plane. A region 14bbs of the oxide semiconductor film 14b adjacent to both of the gate electrode 12b and the source electrode 15bs, and a region 14bbd of the oxide semiconductor film 14b adjacent to both of the gate electrode 12b and the drain electrode 15bd are processed such that the resistance thereof is reduced as compared with the channel part 14bc of the oxide semiconductor film 14b and portions 14bp of the oxide semiconductor film 14b respectively covered by the source electrode 15bs and the drain electrode 15bd. The sheet resistance in each of the regions 14bbs, 14bbd is about 10Ω/sq - 100 kΩsq. Each of the regions 14bbs, 14bbd having the reduced resistance is formed so as to have a width of, e.g., about 5-300 μm. In the processing for reducing the resistance of the oxide semiconductor film 14b, the resistance in at least part of the oxide semiconductor film 14b including a surface thereof may be reduced. The part having the reduced resistance may, as an example, have a thickness of about 2-20 nm, or may have another thickness.

Figure 11:
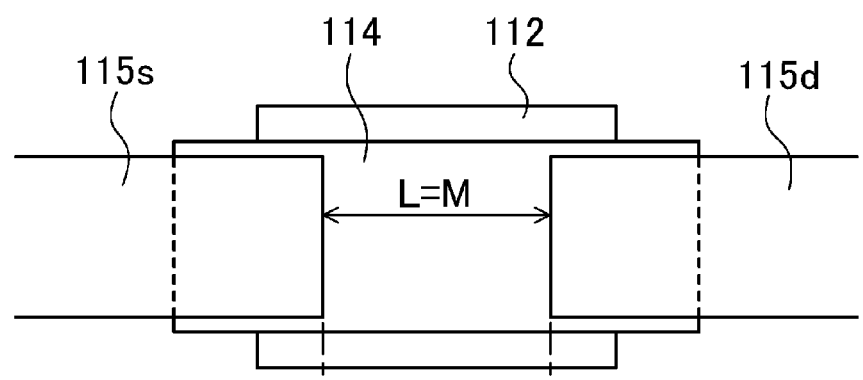
FIGS. 11(a) and 11(b) are plan views illustrating a channel length L in the thin film transistor.
Figure 11:
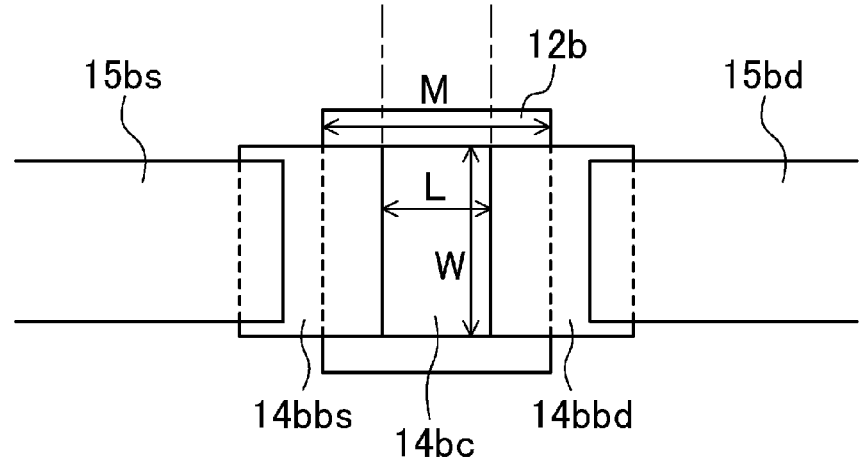

A region of the oxide semiconductor film 14b between the regions 14bbs, 14bbd having the reduced resistance forms the channel part 14bc. The channel part 14bc is formed in, e.g., a rectangular shape. The channel width W is about 5-300 μm, and the channel length L is about 2-20 μm (see FIG. 11(b)).

In the thin film transistor $S_T$, the gate electrode 12b and the source electrode 15bs do not overlap with each other, or the gate electrode 12b and the drain electrode 15bd do not overlap with each other. Thus, parasitic capacitance $C_{gs}$ generated between the gate electrode 12b and the source electrode 15bs or parasitic capacitance $C_{gd}$ generated between the gate electrode 12b and the drain electrode 15bd can be reduced. Even if the gate electrode 12b and the source electrode 15bs do not overlap with each other, or the gate electrode 12b and the drain electrode 15bd do not overlap with each other, the region 14bbs of the oxide semiconductor film 14b adjacent to both of the gate electrode 12b and the source electrode 15bs or the region 14bbd of the oxide semiconductor film 14b adjacent to both of the gate electrode 12b and the drain electrode 15bd is processed such that the resistance thereof is reduced, and therefore the parasitic capacitance $C_{gs}$, $C_{gd}$ can be reduced without reducing on-state current of the thin film transistor $S_T$.

Each of components (e.g., auxiliary capacitive devices $C_S$, the thin film transistors $S_P$ formed in the display region D, and gate-source contact parts GS) other than the thin film transistors $S_T$ formed in the terminal region T has the similar structure to that of a publicly-known TFT substrate, i.e., has the multi-layer structure of the first conductive film 12a, 12c, 12d, the first insulating film 13a, 13c, 13d, the oxide semiconductor film 14d, the second conductive film 15a, 15c, 15d, the passivation film 17a, 17c, 17d, the polarized film 18a, 18c, 18d, and the third conductive film 19a, 19c, 19d (see FIG. 8(b)).

A color filter layer including, on a substrate, a light shielding layer and a colored layer is provided on the counter substrate 20, and a common electrode is provided so as to cover the color filter layer. In addition, an alignment film is provided so as to cover the common electrode.

The liquid crystal layer 30 is made of, e.g., a nematic liquid crystal material having electrooptic properties.

In the liquid crystal display apparatus 1 having the foregoing configuration, a gate signal(s) is, at each pixel, transmitted from the gate driver to the gate electrode 12b through the scanning line 121. When the thin film transistor $S_P$ of the display region D is turned on, a source signal(s) is, at the thin film transistor $S_P$, transmitted from the source driver to a source electrode 15ds through the signal line 15I, and then a predetermined charge is written to the pixel electrode 19d through the oxide semiconductor film 14d and a drain electrode 15dd. At this point, a potential difference between each of the pixel electrodes 19d of the TFT substrate 10 and the common electrode of the counter substrate 20 is generated, and predetermined voltage is applied to the liquid crystal layer 30, i.e., liquid crystal capacitance for each pixel, and to the auxiliary capacitive device $C_S$ connected to the liquid crystal capacitance in parallel. Then, in the liquid crystal display apparatus 1, an alignment state of the liquid crystal layer 30 is, at each pixel, changed depending on the magnitude of voltage applied to the liquid crystal layer 30. In such a manner, a light transmittance of the liquid crystal layer 30 is adjusted, thereby displaying an image.

(Method for Manufacturing TFT Substrate)

Figure 6:
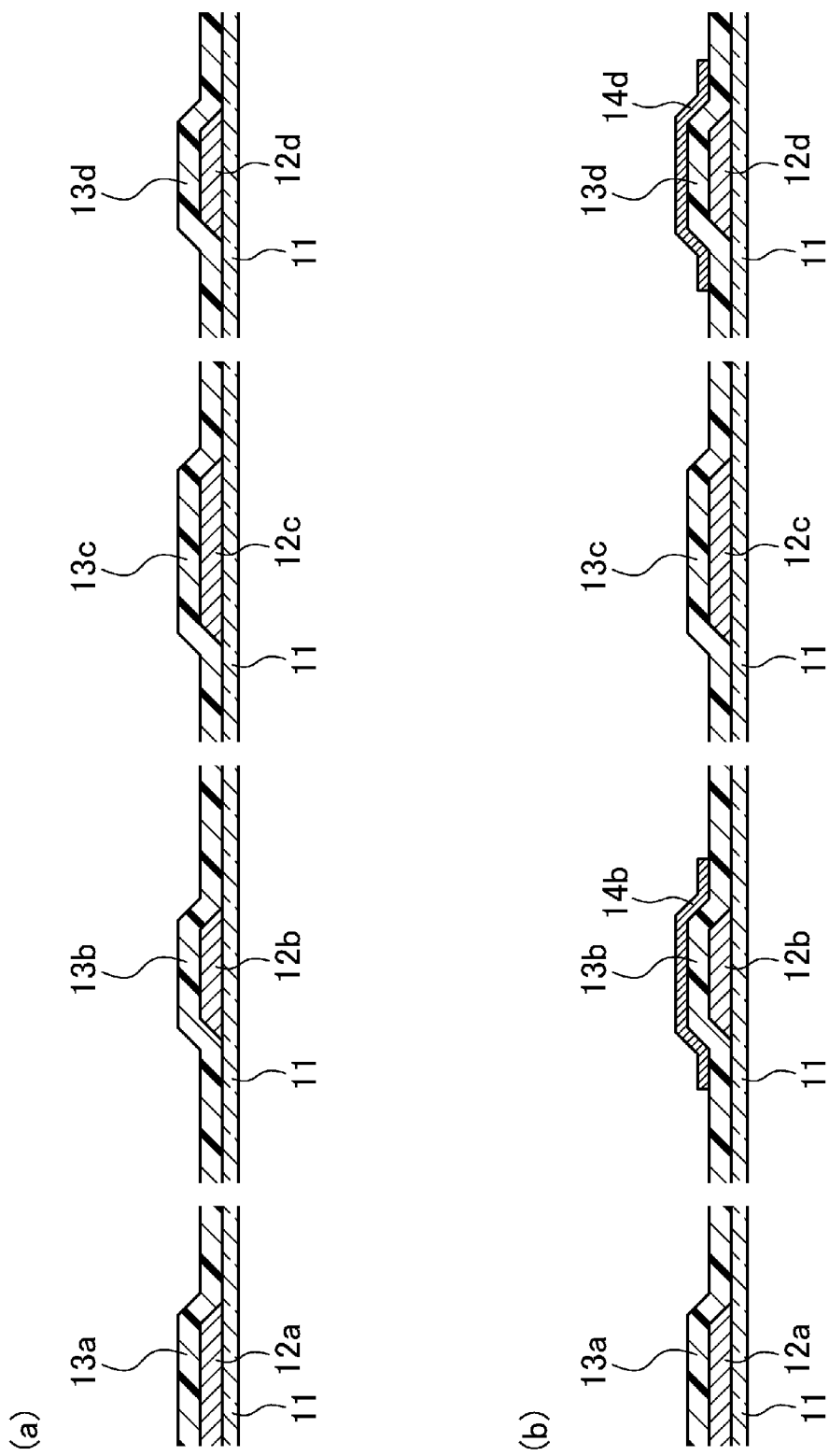
FIGS. 6(a) and 6(b) are views illustrating steps for manufacturing a TFT, and each illustrate cross sections along an A-A line, the B-B line, a C-C line, and a D-D line illustrated in FIG. 4.
Figure 7:
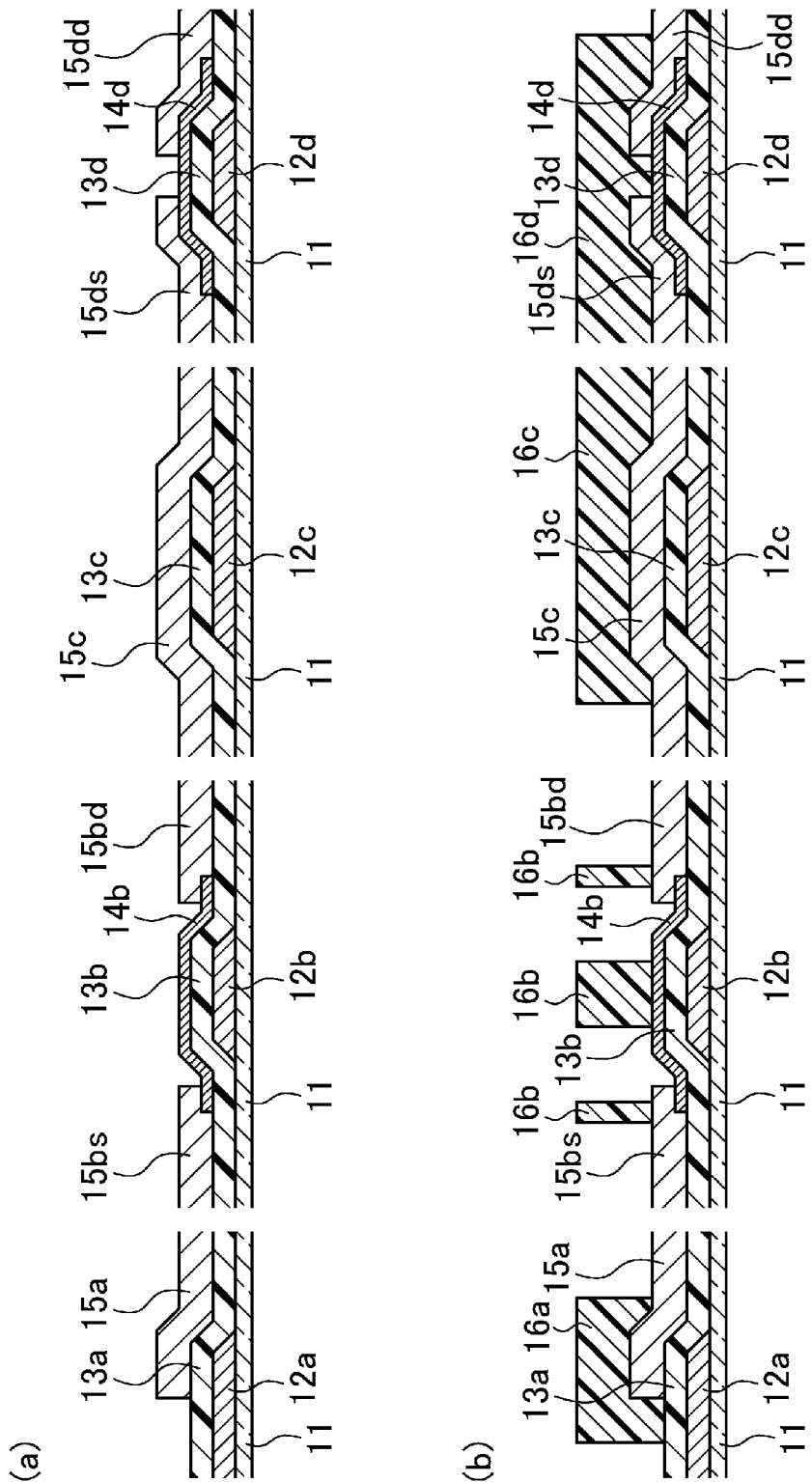
FIGS. 7(a) and 7(b) are views illustrating steps for manufacturing the TFT, and each illustrate the cross sections along the A-A line, the B-B line, the C-C line, and the D-D line illustrated in FIG. 4.
Figure 8:
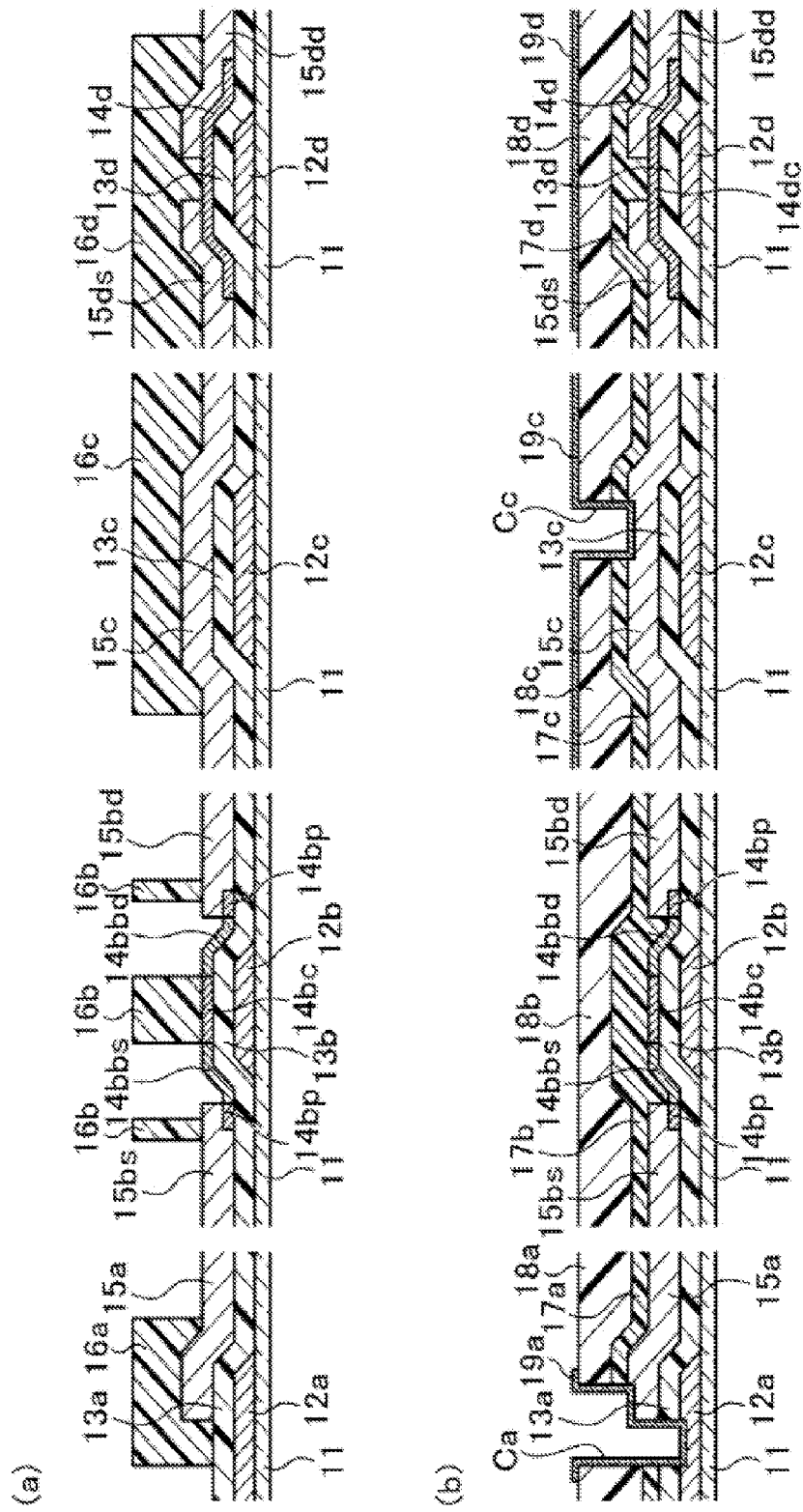
FIGS. 8(a) and 8(b) are views illustrating steps for manufacturing the TFT, and each illustrate the cross sections along the A-A line, the B-B line, the C-C line, and the D-D line illustrated in FIG. 4.

A method for manufacturing the TFT substrate 10 of the present embodiment will be described below with reference to FIGS. 6-8.

First, e.g., the followings are stacked each other to form a first conductive film: a Ti film having a thickness of about 30 nm; an Al film having a thickness of about 200 nm; and a Ti film having a thickness of about 100 nm. Such a film is patterned corresponding to gate-source contact parts GS, thin film transistors $S_T$ of a gate driver region Tg, auxiliary capacitive devices $C_S$, thin film transistors $S_P$ of a display region D. Referring to FIG. 6(a), a SiN film having a thickness of about 325 nm and a $SiO_2$ film having a thickness of about 50 nm are stacked on the first conductive films 12a-12d which have been patterned, and then first insulating films 13a-13d are formed.

Subsequently, e.g., an oxide semiconductor film having a thickness of about 40 nm is formed. Referring to FIG. 6(b), such a film is patterned corresponding to the thin film transistors $S_T$ of the gate driver region Tg and the thin film transistors Sp of the display region D. The sheet resistance of the formed oxide semiconductor films 14b, 14d is, e.g., about $1 \times 10^{12}$–$1 \times 10^{17}$ Ω/sq.

Figure 9:
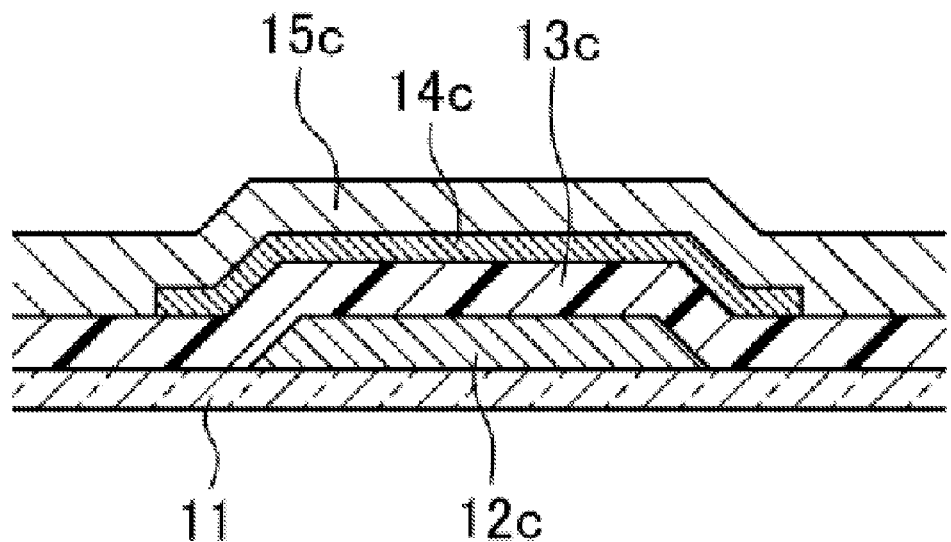
FIG. 9 is a cross-sectional view illustrating a variation of an auxiliary capacitive device.

Note that the oxide semiconductor film may be, referring to FIG. 9, patterned so as to cover the auxiliary capacitive devices $C_S$.

Next, e.g., the followings are stacked each other to form a second conductive film: a Ti film having a thickness of about 30 nm; an Al film having a thickness of about 200 nm; and a Ti film having a thickness of about 100 nm. Then, such a film is patterned. At this point, referring to FIG. 7(b), the second conductive film is patterned such that an end part of the second conductive film 15a is, at each of the gate-source contact parts GS, positioned above the first conductive film 12a with the first insulating film 13a being interposed between the second conductive film 15a and the first conductive film 12a. In each of the thin film transistors $S_T$ of the gate driver region Tg, a source electrode 15bs and a drain electrode 15bd are formed so as not to overlap with the first conductive film 12b. In each of the auxiliary capacitive devices $C_S$, the second conductive film 15c is provided so as to cover the auxiliary capacitive device $C_S$. In each of the thin film transistors $S_P$ of the display region D, the second conductive film 15d is patterned such that a source electrode 15ds and a drain electrode 15dd are formed in the state in which part of the oxide semiconductor film 14d which will be a channel part 14dc remains above the first conductive film 12d.

Figure 10:
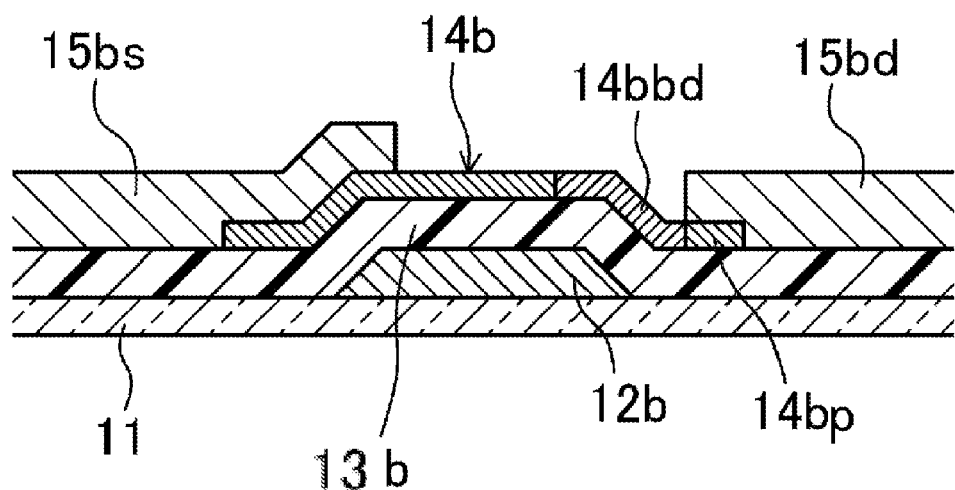
FIG. 10 is a cross-sectional view illustrating a variation of the thin film transistor of the embodiment.

At this point, in each of the thin film transistor $S_T$ of the gate driver region Tg, the gate electrode 12b and the drain electrode 15bd may be, referring to FIG. 10, provided so as not to overlap with each other as viewed in the plane, and the gate electrode 12b and the source electrode 15bs may be provided so as to partially overlap with each other as viewed in the plane. In such a case, parasitic capacitance $C_{gd}$ between the gate electrode 12b and the drain electrode 15bd is reduced, and therefore a channel width W can be reduced by the foregoing reduction amount. Conversely, the gate electrode 12b and the source electrode 15bs may be provided so as not to overlap with each other as viewed in the plane, and the gate electrode 12b and the drain electrode 15bd may be provided so as to partially overlap with each other as viewed in the plane.

Next, referring to FIG. 7(b), a resist film is applied to a thickness of 1-2 µm, and then is exposed to light and is developed to form resists 16a-16d. Note that the resist film is exposed to light from a side closer to the substrate (i.e., a side opposite to the resist film), and the resists 16a-16d are formed only on the first conductive film 12 and the second conductive film 15. At this point, a light exposure time is adjusted in order to form the resist 16b corresponding to the channel part 14bc on an inner side in part of the gate driver region Tg where each of the thin film transistors $S_T$ is formed.

Figure 12:
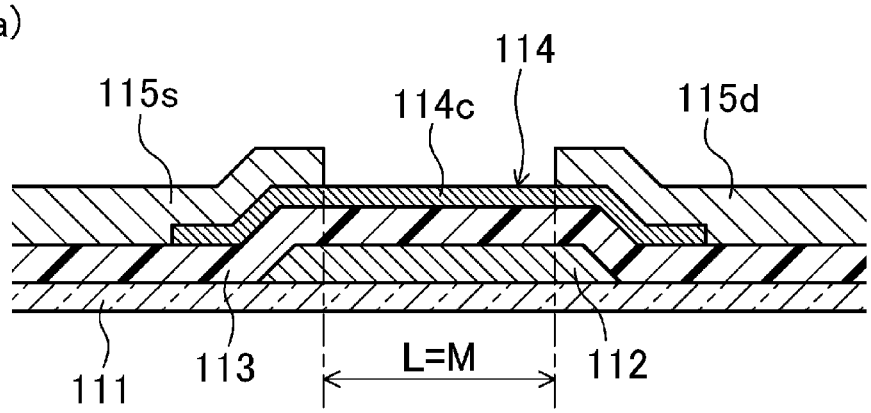
FIGS. 12(a) and 12(b) are cross-sectional views illustrating the channel length L in the thin film transistor.
Figure 12:
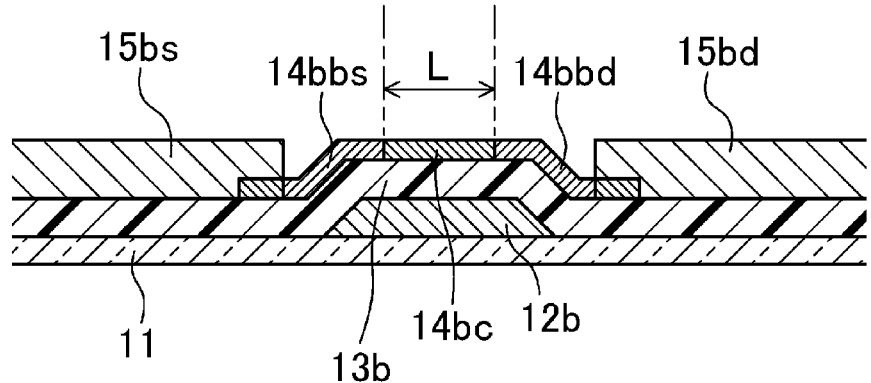

Since the resist film is exposed to light from the side closer to the substrate to form the resists 16a-16d, the resist 16b defining the channel part 14bc has a width smaller than that of the gate electrode 12b. Thus, since the channel part 14bc is formed such that the width of the gate electrode is, referring to FIGS. 11(b) and 12(b), equal to a dimension M of a mask, a channel length L of the channel part 14bc is smaller than the dimension M of the mask as compared to the case where a channel length L of a channel part 114c is, referring to FIGS. 11(a) and 12(a), specified by patterning using a mask (i.e., the case where a dimension M of the mask is equal to the channel length L). Thus, on-state current of the thin film transistor $S_T$ is increased, thereby realizing higher-speed driving.

Subsequently, referring to FIG. 8(a), annealing under hydrogen atmosphere or hydrogen plasma processing is performed, thereby processing a region of the oxide semiconductor films 14b, 14d which is not covered by the resists 16b, 16d to reduce the resistance of such a region as compared with the channel part 14bc of the oxide semiconductor film 14b which is covered by the resist 16b and portions 14bp of the oxide semiconductor film 14b respectively covered by the source electrode 15bs and the drain electrode 15bd. Thus, in each of the thin film transistors $S_T$ of the gate driver region Tg, sheet resistance in the region of the oxide semiconductor film 14b which is not covered by the resist 16b or the second conductive film 15b is, e.g., 10 Ω/sq -100 kΩ/sq. After the processing for reducing the resistance, the resists 16a-16d are removed.

Subsequently, referring to FIG. 8(b), e.g., a $SiO_2$ film having a thickness of about 265 nm is formed on the entirety of a substrate 11 as passivation films 17a-17d, and, e.g., a photosensitive resin film is formed on the entirety of the substrate 11 as polarized films 18a-18d. Then, in each of the gate-source contact parts GS, a contact hole Ca through which both of the first conductive film 12a and the second conductive film 15a are exposed is formed. In addition, in each of the auxiliary capacitive devices $C_S$, a contact hole Cc extending from the polarized film 18c to the second conductive film 15c is formed. Then, e.g., an ITO film having a thickness of about 100 nm is formed as third conductive films 19a, 19c, 19d. Such a film is patterned such that a surface of the contact hole Ca is covered in each of the gate-source contact parts GS, and that a pixel electrode 19d (19c) including the thin film transistor $S_P$ of the display region D and the auxiliary capacitive device $C_S$ is formed.

Finally, an alignment film is formed so as to cover the display region D, and a TFT substrate 10 is manufactured.

A liquid crystal display apparatus 1 can be formed by, e.g., bonding the TFT substrate 10 to a counter substrate 20 additionally formed by a publicly-known method with a sealing material 40 being interposed between the TFT substrate 10 and the counter substrate 20 and by providing a liquid crystal layer 30 between the TFT substrate 10 and the counter substrate 20.

Note that, in each of the thin film transistors $S_T$ and $S_P$, a second insulating film 50b, 50d may be formed between the oxide semiconductor film 14b, 14d and the second conductive film 15b, 15d so as to cover the channel part 14bc, 14dc.

Figure 13:
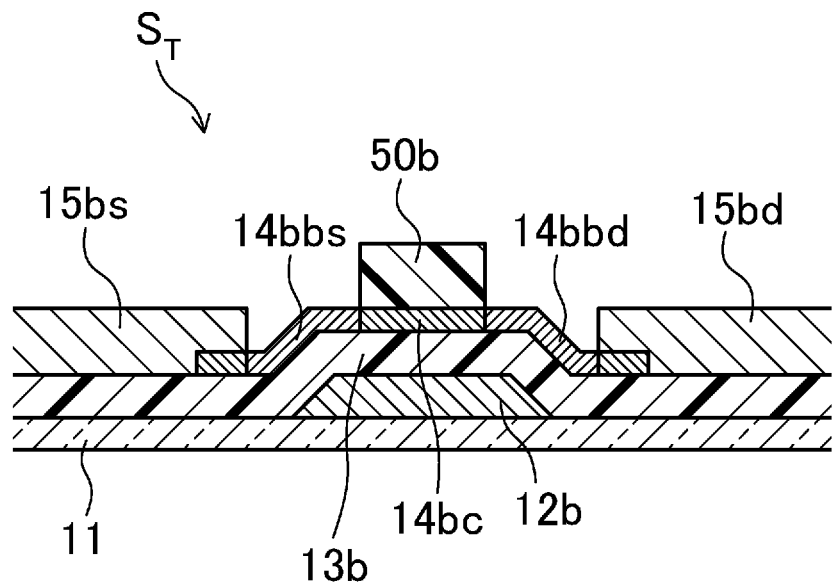
FIG. 13 is a cross-sectional view illustrating a variation of the thin film transistor of the embodiment.

Referring to FIG. 13, if the second insulating film 50b is provided so as to cover the channel part 14bc of the thin film transistor $S_T$ of the gate driver region Tg, the channel part 14bc of the oxide semiconductor film 14b can be covered by the second insulating film 50b right after formation of the oxide semiconductor film 14b. Thus, the channel part 14bc is less likely to be susceptible to electric stress or temperature stress caused due to external factors, and therefore operation properties of the TFT are enhanced.

Figure 14:
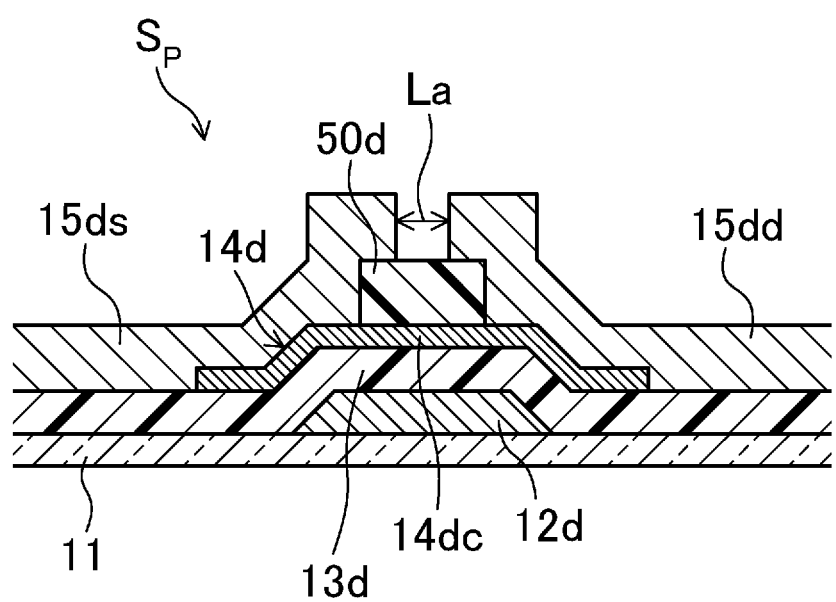
FIG. 14 is a cross-sectional view illustrating a variation of the thin film transistor provided in a pixel region.

Referring to FIG. 14, if the second insulating film 50d is provided so as to cover the channel part 14dc of the thin film transistor Sp of the display region D, the source electrode 15ds and the channel part 14dc are provided so as to partially overlap with each other, or the drain electrode 15dd and the channel part 14dc are provided so as to partially overlap with each other. Thus, an effective channel length La is reduced by the overlap part, and on-state current of the thin film transistor $S_P$ is increased. Consequently, higher-speed driving can be realized.

It has been described that the processing for reducing the resistance of the oxide semiconductor film 14b is performed after the patterning of the second conductive film. However, the processing for reducing the resistance may be performed after the formation of the oxide semiconductor film and before the patterning of the oxide semiconductor film, or the processing for reducing the resistance of the oxide semiconductor film 14b may be performed after the formation of the oxide semiconductor film.

Figure 15:
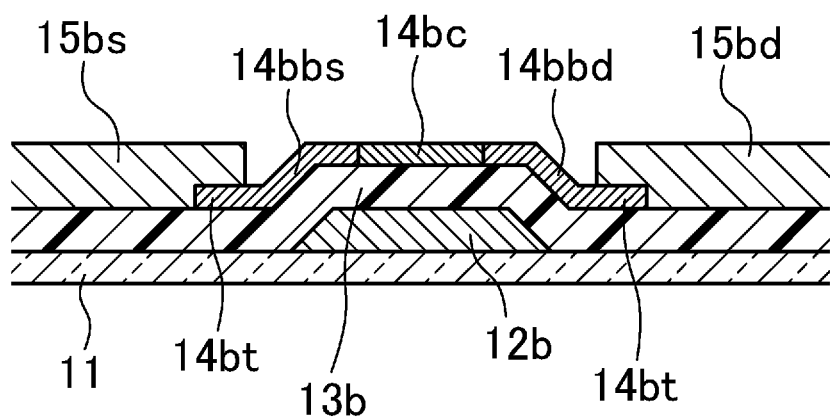
FIG. 15 is a cross-sectional view illustrating a variation of the thin film transistor of the embodiment.
Figure 16:
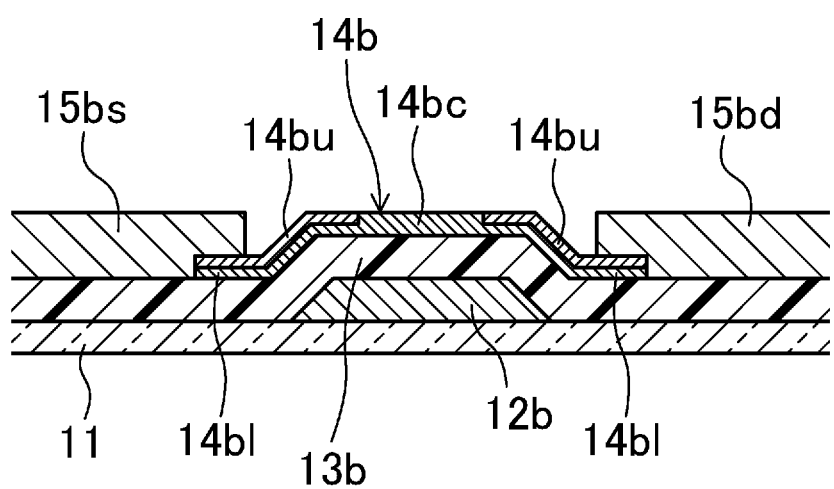
FIG. 16 is a cross-sectional view illustrating a variation of the thin film transistor of the embodiment.

Referring to FIG. 15, if the processing for reducing the resistance of the oxide semiconductor film 14b is performed before the second conductive film 15b is provided, the sheet resistance in a region 14bt of the oxide semiconductor film 14b covered by second conductive films 15bs, 15bd is reduced. Thus, contact resistance between the oxide semiconductor film 14b and each of the second conductive films 15bs, 15bd is reduced, and on-state current of the thin film transistor $S_T$ is increased. Consequently, the higher-speed driving can be realized. Such a thin film transistor $S_T$ can be more preferably used by a peripheral drive circuit. If the resistance in only a surface part 14bu of the oxide semiconductor film 14b is reduced referring to FIG. 16, there is a possibility that the low-resistance surface part 14bu of the oxide semiconductor film 14b is etched when the second conductive films 15bs, 15bd are patterned and only part 14b1 which is below the surface part 14bu and which is not processed such that the resistance thereof is reduced remains. Thus, if the processing for reducing the resistance of the oxide semiconductor film 14b is performed before the second conductive films 15bs, 15bd are provided, it is necessary to perform controls relating to, e.g., the thickness of the oxide semiconductor film 14b for which the processing for reducing the resistance is performed and the etching depth.

Figure 17:
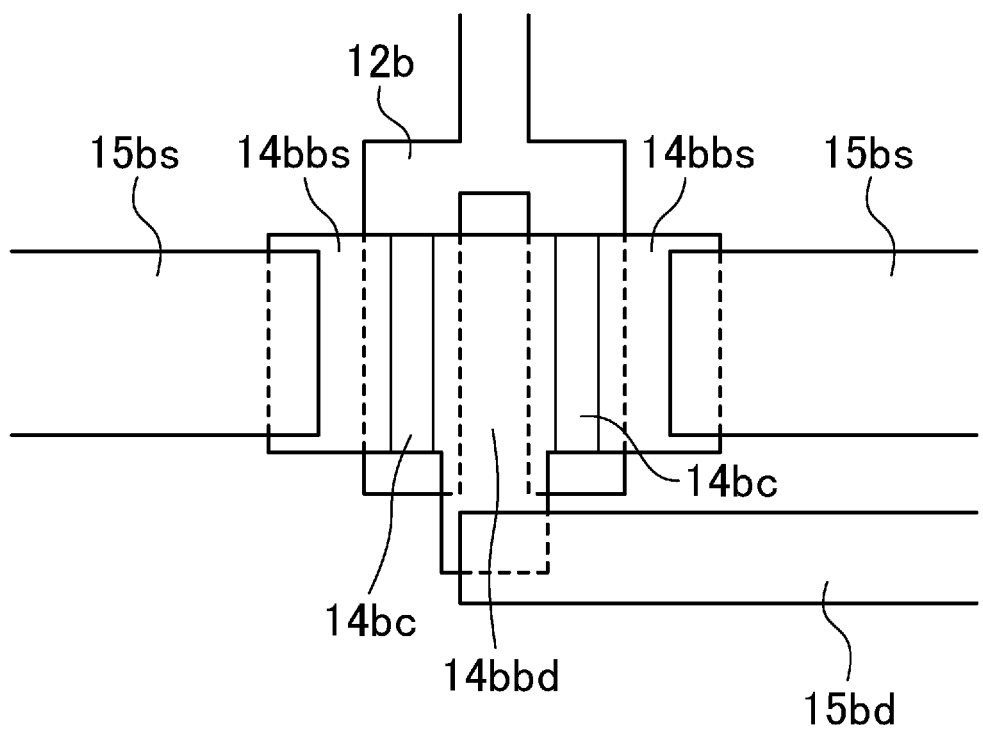
FIG. 17 is a plan view illustrating a variation of the thin film transistor of the embodiment.
Figure 18:
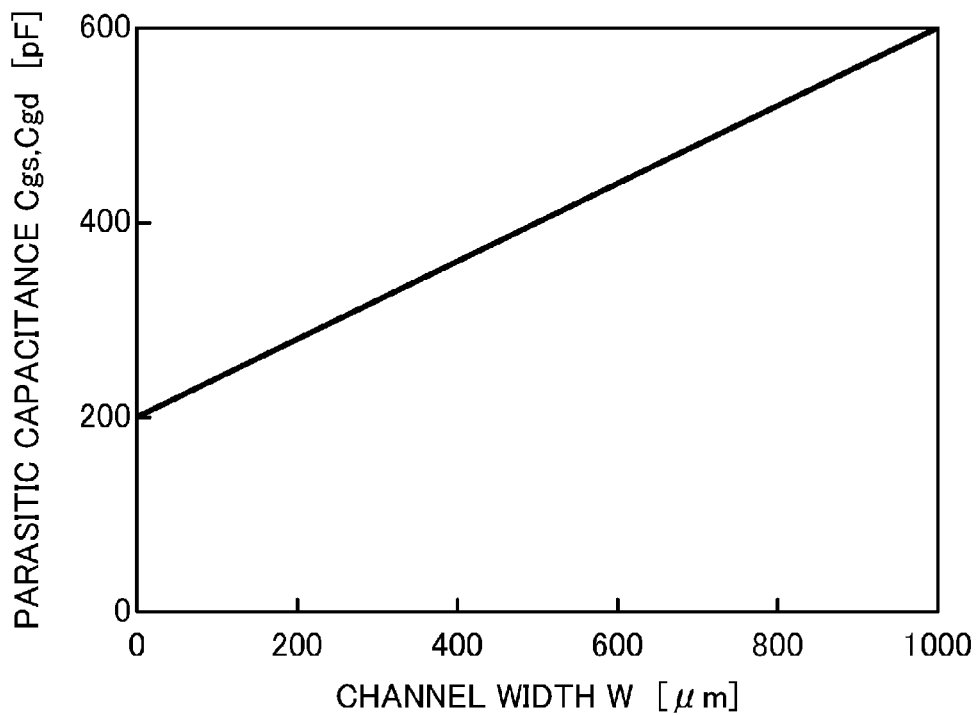
FIG. 18 is a graph illustrating a relationship between a channel width W and parasitic capacitance $C_{gs}$, $C_{gd}$ in the thin film transistor provided in a buffer circuit of a gate driver region.
Figure 19:
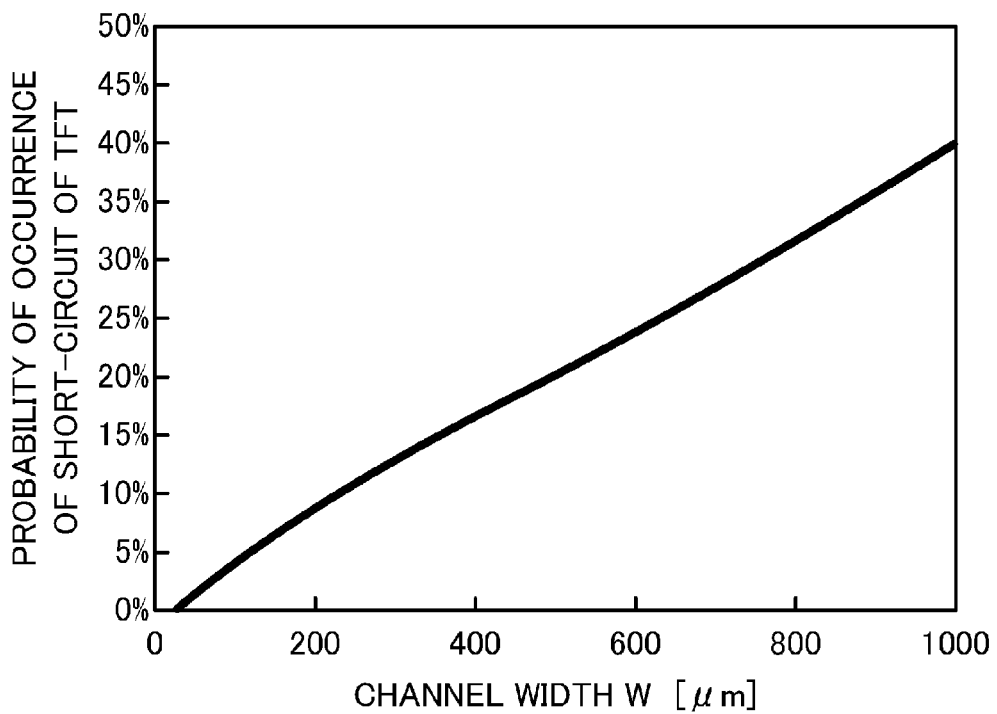
FIG. 19 is a graph illustrating a relationship between the channel width W and the probability of occurrence of short-circuit of the TFT in the thin film transistor provided in the buffer circuit of the gate driver region.

A plurality of channel parts 14bc may be provided on a single oxide semiconductor film 14b. In such a case, referring to, e.g., FIG. 17, a layout may be employed, in which two source electrodes 15bs are provided so as to sandwich two channel parts 14bc which are positioned so as to face each other and a drain electrode 15bd is provided at each of end parts of the channel parts 14bc. At this point, a region 14bbs of the oxide semiconductor film 14b between the source electrode 15bs and the gate electrode 12b and a region 14bbd of the oxide semiconductor film 14b between the drain electrode 15bd and the gate electrode 12b are processed such that the resistance thereof is reduced.

It has been described that the thin film transistor $S_T$ of the present invention is provided at the last stage of the gate driver region Tg. However, the thin film transistor $S_T$ of the present invention may be formed at part other than the last stage of the gate driver region Tg, or may be formed corresponding to each pixel of the display region D.

According to the foregoing embodiment, the gate electrode 12b and the source electrode 15bs does not overlap with each other, or the gate electrode 12b and the drain electrode 15bd do not overlap with each other. Thus, the parasitic capacitance $C_{gs}$ generated between the gate electrode 12b and the source electrode 15bs or the parasitic capacitance $C_{gd}$ generated between the gate electrode 12b and the drain electrode 15bd can be reduced. Even if the gate electrode 12b and the source electrode 15bs do not overlap with each other, or the gate electrode 12b and the drain electrode 15bd do not overlap with each other, the region 14bbs of the oxide semiconductor film 14b adjacent to both of the gate electrode 12b and the source electrode 15bs or the region 14bbd of the oxide semiconductor film 14b adjacent to both of the gate electrode 12b and the drain electrode 15bd are processed such that the resistance thereof is reduced. Thus, the parasitic capacitance $C_{gs}$, $C_{gd}$ can be reduced without reducing on-state current of the thin film transistor. Consequently, the parasitic capacitance $C_{gs}$, $C_{gd}$ generated between the gate electrode 12b and the source electrode 15bs and/or between the gate electrode 12b and the drain electrode 15bd is reduced, thereby reducing the channel width W of the thin film transistor $S_T$. Due to the small channel width W of the thin film transistor $S_T$ including the oxide semiconductor film 14b, short-circuit of the thin film transistor $S_T$ is less likely to occur, and, as a result, a good yield rate can be obtained.

INDUSTRIAL APPLICABILITY

The present invention is useful for the semiconductor device including the oxide semiconductor film, the thin film transistor substrate including the semiconductor device, and the display apparatus.

DESCRIPTION OF REFERENCE CHARACTERS

1 Liquid Crystal Display Apparatus
Tg Gate Driver Region
$S_T$ Semiconductor Device (Thin Film Transistor)
W Channel Width
10 TFT Substrate
11 Substrate
12b Gate Electrode (First Conductive Film)
13b Gate Insulating Film (First Insulating Film)
14b Oxide Semiconductor Film
14b, 14d Oxide Semiconductor Film
14bc Channel Part
15bd Drain Electrode (Second Conductive Film)
15bs Source Electrode (Second Conductive Film)
20 Counter Substrate
30 Liquid Crystal Layer

The invention claimed is:

1. A semiconductor device, comprising:
a substrate;
a gate electrode provided on the substrate;
a gate insulating film provided so as to cover the gate electrode;
an oxide semiconductor film provided on the gate insulating film and including a channel portion having a channel sheet resistance and arranged in a position facing the gate electrode; and
a source electrode and a drain electrode provided apart from each other on the oxide semiconductor film with the channel part being interposed between the source electrode and the drain electrode, wherein
at least one of the source electrode and the drain electrode is arranged so as not to overlap with the gate electrode as viewed in a plan view,
the oxide semiconductor film further includes a first portion having a first sheet resistance, which is smaller than the channel sheet resistance, the first portion extends from an edge of the at least one of the source electrode and the drain electrode towards the channel portion, and the first portion is overlapped by the gate electrode, and
the oxide semiconductor film further includes a second portion having a second sheet resistance, which is larger than the first sheet resistance, the second portion being located beneath the at least one of the source electrode and the drain electrode.

2. The semiconductor device of claim 1, wherein the first sheet resistance of the first region of the oxide semiconductor film is 10 Ω/sq-100 kΩ/sq.

3. The semiconductor device of claim 1, wherein the channel portion includes a channel width of equal to or less than 50 μm.

4. The semiconductor device of claim 1, wherein the oxide semiconductor film is made of metal oxide containing at least one selected from a group consisting of indium (In), gallium (Ga), and zinc (Zn).

5. The semiconductor device of claim 4, wherein the oxide semiconductor film is made of In—Ga—Zn—O metal oxide.

6. A thin film transistor substrate, comprising:
a thin film transistor provided on a substrate body,
wherein the thin film transistor is the semiconductor device of claim 1.

7. The thin film transistor substrate of claim 6, wherein the semiconductor device is provided at a last stage of a buffer circuit of a gate driver region.

8. A display apparatus, comprising:
the thin film transistor substrate of claim 6;
a counter substrate arranged so as to face the thin film transistor substrate; and
a display medium layer provided between the thin film transistor substrate and the counter substrate.

9. The display apparatus of claim 8, wherein the display medium layer is a liquid crystal layer.

10. The semiconductor device of claim 1, wherein a position of an edge of the first portion which is opposite to the channel portion is located at substantially the same position as the edge of the at least one of the source electrode and the drain electrode when viewed in the plan view.

11. The semiconductor device of claim 1, wherein an edge of the first portion which is opposite to the channel portion is extended beneath the at least one of the source electrode and the drain electrode.

12. A display apparatus, comprising:
a first substrate;
a first transistor provided in a display region of the display apparatus;
a second transistor included in a peripheral driver circuit which is positioned outside of the display region;
the first transistor including:
a first gate electrode provided on the first substrate;
a first gate insulating film provided so as to cover the first gate electrode;

a first oxide semiconductor film provided on the first gate insulating film and including a first channel portion arranged in a position facing the first gate electrode; and a first source electrode and a first drain electrode provided apart from each other on the first oxide semiconductor film with the first channel portion being interposed between the first source electrode and the first drain electrode; wherein the second transistor including:

a second gate electrode provided on the first substrate;

a second gate insulating film provided so as to cover the second gate electrode;

a second oxide semiconductor film provided on the second gate insulating film and including a second channel portion having a channel sheet resistance and arranged in a position facing the second gate electrode; and a second source electrode and a second drain electrode provided apart from each other on the second oxide semiconductor film with the second channel portion being interposed between the second source electrode and the second drain electrode;

wherein the first source electrode and the first drain electrode are overlapped with the first gate electrode when viewed in a plan view;

at least one of the second source electrode and the second drain electrode is arranged so as not to overlap with the second gate electrode as viewed in the plan view;

the second oxide semiconductor film further includes a first portion having a first sheet resistance, which is smaller than the channel sheet resistance, the first portion extends from an edge of the at least one of the second source electrode and the second drain electrode towards the second channel portion, and the first portion is overlapped by the second gate electrode; and the second oxide semiconductor film further includes a second portion having a second sheet resistance, which is larger than the first sheet resistance, the second portion being located beneath the at least one of the second source electrode and the second drain electrode.

13. The display apparatus of claim 12, wherein sheet resistance in the region of the second oxide semiconductor film where the resistance is reduced is 10 Ω/sq-100 kΩ/sq.

14. The display apparatus of claim 12, wherein the second channel portion has a channel width of equal to or less than 50μm.

15. The display apparatus of claim 12, wherein the first and second oxide semiconductor films are made of metal oxide containing at least one selected from a group consisting of indium (In), gallium (Ga), and zinc (Zn).

16. The display apparatus of claim 15, wherein the first and second oxide semiconductor films are made of In—Ga—Zn—O metal oxide.

17. The display apparatus of claim 12, wherein the second transistor is provided at a last stage of a buffer circuit of a gate driver region.

18. The display apparatus of claim 12, further comprising:
a second substrate arranged so as to face the first substrate; and
a display medium layer provided between the first substrate and the second substrate.

19. The display apparatus of claim 18, wherein the display medium layer is a liquid crystal layer.

* * * * *